United States Patent
Jesmanowicz

(10) Patent No.: US 7,328,054 B2
(45) Date of Patent: Feb. 5, 2008

(54) PERFUSION MAGNETIC RESONANCE IMAGING USING ENCODED RF TAGGING PULSES

(75) Inventor: Andrzej Jesmanowicz, Wauwatosa, WI (US)

(73) Assignee: The MCW Research Foundation, Inc., Milwaukee, WI (US)

(*) Notice: Subject to any disclaimer, the term of this patent is extended or adjusted under 35 U.S.C. 154(b) by 923 days.

(21) Appl. No.: 10/410,710

(22) Filed: Apr. 9, 2003

(65) Prior Publication Data
US 2004/0204643 A1    Oct. 14, 2004

(51) Int. Cl.
*A61B 5/05* (2006.01)
(52) U.S. Cl. ............... 600/410; 600/419; 600/407
(58) Field of Classification Search ........ 600/410, 600/419, 407
See application file for complete search history.

(56) References Cited

U.S. PATENT DOCUMENTS

| | | | |
|---|---|---|---|
| 5,402,785 A | 4/1995 | Leigh et al. | |
| 5,846,197 A | 12/1998 | Edelman | |
| 6,271,665 B1 | 8/2001 | Berr et al. | |
| 6,285,900 B1 | 9/2001 | Stuber et al. | |
| 6,295,465 B1 | 9/2001 | Simonetti | |
| 6,564,080 B1* | 5/2003 | Kimura | 600/410 |
| 6,778,847 B2* | 8/2004 | Wu et al. | 600/410 |
| 2001/0018559 A1* | 8/2001 | Itagaki et al. | 600/413 |
| 2004/0059213 A1* | 3/2004 | Kassai et al. | 600/410 |

OTHER PUBLICATIONS

QUIPPS II With Thin-Slice TI1 Periodic Saturation: A Method For Improving Accuracy of Quantitative Perfusion Imaging Using Pulsed Arterial Spin Labeling; MRM 41: 1246-1254 (1999) Wen-Ming Luh, et al.

* cited by examiner

Primary Examiner—Brian L. Casler
Assistant Examiner—Jacqueline Cheng
(74) Attorney, Agent, or Firm—Quarles & Brady LLP

(57) ABSTRACT

A perfusion image is produced by acquiring a series of time course MR images from an imaging slice. During the acquisition spins flowing into the slice are repeatedly tagged with an RF tagging pulse having a flip angle that is modulated according to a tagging pattern. Voxels in the series of reconstructed MR images having signals which vary according to the tagging pattern indicate perfusion. Perfusion images indicating either flow or velocity are produced.

12 Claims, 9 Drawing Sheets

PERFUSION MAGNETIC RESONANCE IMAGING USING ENCODED RF TAGGING PULSES

STATEMENT REGARDING FEDERALLY SPONSORED RESEARCH

This invention was made with government support under Grant No. 8P01EB002014-09 and 8R01EB000215-16 awarded by the National Institute of Health. The United States Government has certain rights in this invention.

BACKGROUND OF THE INVENTION

The field of the invention is nuclear magnetic resonance imaging methods and systems. More particularly, the invention relates to the production of MRI perfusion images.

Any nucleus which possesses a magnetic moment attempts to align itself with the direction of the magnetic field in which it is located. In doing so, however, the nucleus processes around this direction at a characteristic angular frequency (Larmor frequency) which is dependent on the strength of the magnetic field and on the properties of the specific nuclear species (the magnetogyric constant gamma γ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net longitudinal magnetization $M_0$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net longitudinal magnetization, $M_0$, may be rotated, or "tipped" into the x-y plane to produce a net transverse magnetic moment $M_t$, which is rotating, or spinning, in the x-y plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

Perfusion as related to tissue refers to the exchange of oxygen, water and nutrients between blood and tissue. The measurement of tissue perfusion is important for the functional assessment of organ health. Images which show by their brightness the degree to which tissues are perfused can be used, for example, to assess the scope of brain tissues which have been damaged by a stroke, or to assess the scope of myocardial tissue damage resulting from a heart attack.

A number of methods have been used to produce perfusion images using magnetic resonance imaging techniques. One technique, as exemplified by U.S. Pat. No. 6,295,465, is to determine the wash-in or wash-out kinetics of contrast agents such as chelated gadolinium. In addition to the need for injection of a contrast agent, these methods require the acquisition and subtraction of baseline images.

Another class of MR perfusion imaging techniques attempts to measure blood flow by "tagging" or "labeling" spins flowing into a region of interest by applying RF excitation in an adjacent region and then acquiring image data from the region of interest. By subtracting a baseline image acquired without RF tagging, perfusion information is acquired and imaged. Repeated acquisitions and averaging of the results is used to improve perfusion image signal-to-noise ratio (SNR). Examples of these techniques are disclosed in U.S. Pat. Nos. 5,402,785; 6,285,900; 5,846,197; and 6,271,665 and the publications "Quantification Of Relative Cerebral Blood Flow Change By Flow-Sensitive Alternating Inversion Recovery Technique; Application to Functional Mapping" by S. G. Kim *Magn. Reson. Med.* 34(3): 297-301, 1995; "MR Perfusion Studies With $T_1$-Weighted Echo Planar Imaging", by K. K. Wong et al *Magn. Reson. Med.* 34:878-887 (1995); and "QUIPSS II With Thin-Slice TI, Periodic Saturation" A Method For Improving Accuracy Of Quantitative Perfusion Imaging Using Pulsed Arterial Spin Labeling" by Luh et al *Magn. Reson. Med.* 41:1246-1254 (1999).

In all of these methods the amplitude or amplitude change of the NMR signal at each image voxel is the measure of perfusion at that location in the subject tissue. The basic structure of these NMR perfusion sequences includes one tagging slice and one imaging slice as shown in FIG. 3, separated by a distance (e.g., 5 mm) and excited at two different moments (e.g., 500 ms apart). If the tagging pulse inverts the magnetization by 180° in a tagging slice and there is flow of one cm/sec in the direction of the imaging slice, then the total magnetization $M_0$ in this slice will be reduced when transverse magnetization is produce by an imaging pulse sequence. The detected NMR signal in a given voxel into which tagged spins flow will, therefore, be lower than without tagging. A similar effect can be obtained by pure saturation, i.e., by applying a tagging pulse flip angle equal to 90°. In this case, the signal reduction will be smaller. The levels of longitudinal spin magnetization $M_0$ of inflowing tagged blood are shown in FIG. 4. Point Inv marks the longitudinal magnetization value for a 180° pulse, point Sat for a 90° pulse, and point Norm for a 0° tagging pulse. The general principle of flow detection is to subtract two images, one with no tagging and one which has been tagged. In the experiment illustrated in FIG. 3, only one flow velocity can be detected—exactly one cm/sec. Slower flowing blood will not arrive at the time of image acquisition; faster flowing blood will overshoot the slice. The sensitivity of this method is poor for several reasons: the $T_1$ relaxation of blood is less than one second at a polarizing field of 3T, and the total volume of the microvascular structure is only a small part of the imaging voxel. To improve sensitivity, usually a plurality of imaging pairs is acquired and the differential signals are averaged. The repetition time (TR) has to be long enough for longitudinal magnetization to relax fully.

SUMMARY OF THE INVENTION

The present invention is a method for producing a perfusion image by repeatedly RF tagging spins flowing into an image slice and modulating the RF tagging in accordance with a tagging pattern over a modulation time period, acquiring a set of time course MR images from the image slice over a time period that includes the modulation time period; detecting voxels in the MR images which vary in accordance with the tagging pattern; and indicating perfusion into the detection voxels.

Both the RF tagging and image acquisition can be done in a single pulse sequence which is repeated to both play out the tagging pattern and acquire the time course MR images. A variety of different tagging patterns can be used and different techniques may be used to detect the tagging pattern in time course image voxels. Perfusion can be indicated in an image which indicates by the brightness of its pixels the perfusion detected in corresponding time course image voxels. Brightness may indicate flow velocity or flow volume.

GENERAL DESCRIPTION OF THE INVENTION

Figure 3:
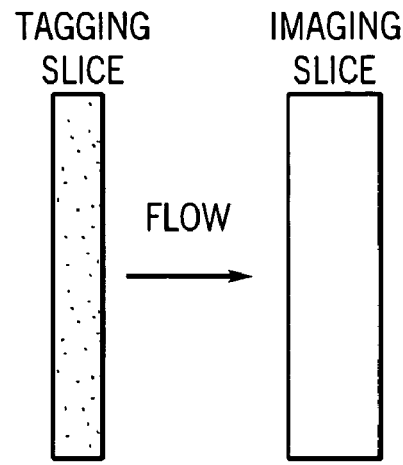
FIG. 3 is a schematic representation of an image slice and tagging slice used to produce MRI perfusion images.
Figure 8:
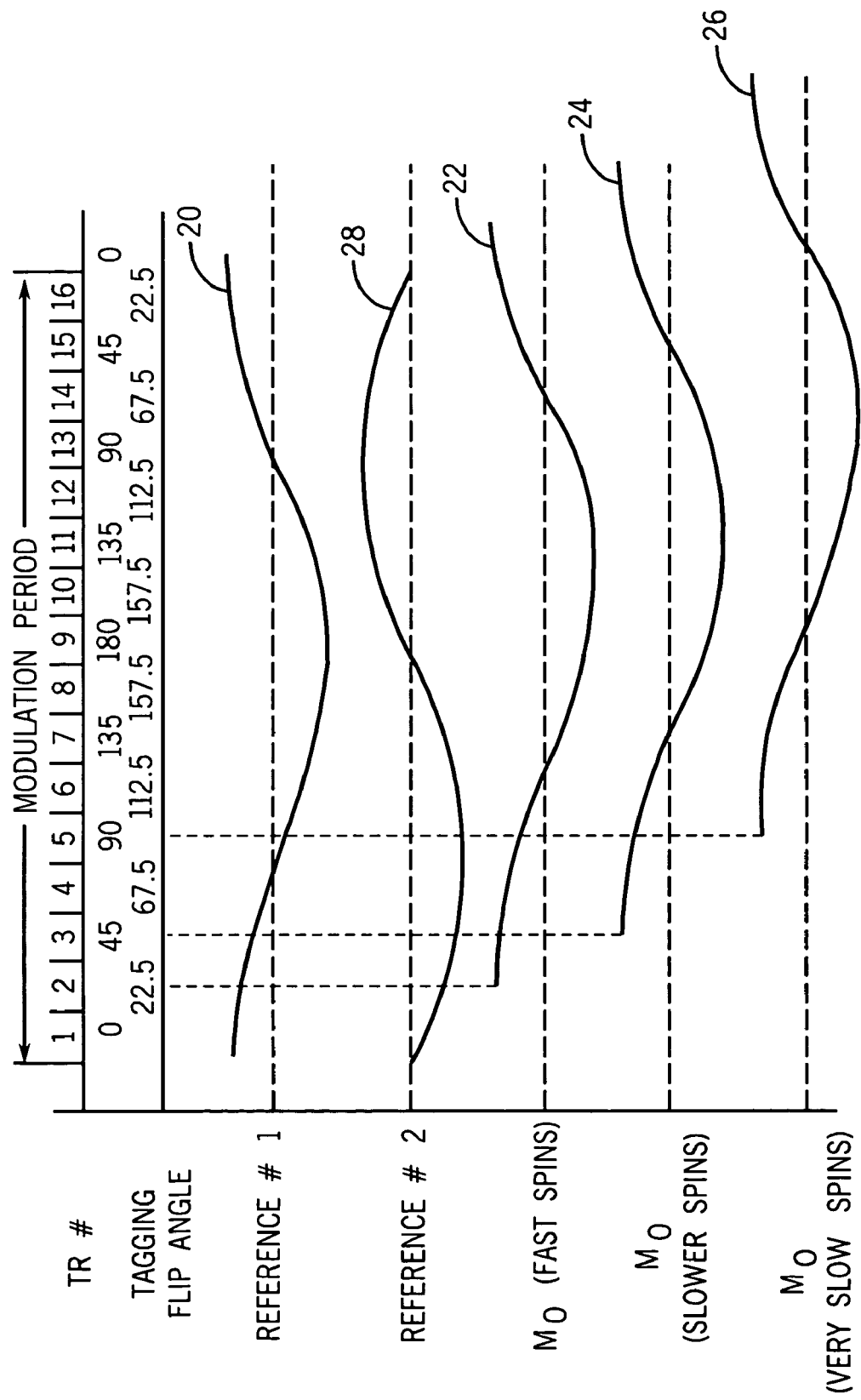
FIG. 8 is a graphic illustration of the modulation of the RF tagging that is performed in accordance with a preferred embodiment of the invention.

Referring to FIG. 3, in its most basic form the present invention requires the production of an RF tagging pulse to reduce longitudinal magnetization $M_0$ in a tagging slice, followed by the acquisition of an MR image from an adjacent imaging slice. This pulse sequence is repeated and the flip angle $\phi$ of the RF tagging pulse is modulated in value from 0° to 180° to modulate the longitudinal magnetization $M_0$ within the tagging slice over a modulation period. Referring to FIG. 8, for example, the pulse sequence may be repeated sixteen times and the RF tagging pulse flip angle increased 22.5° each repetition. Over the modulation period, therefore, the longitudinal magnetization $M_0$ will be sinusoidally modulated in amplitude.

Figure 4:
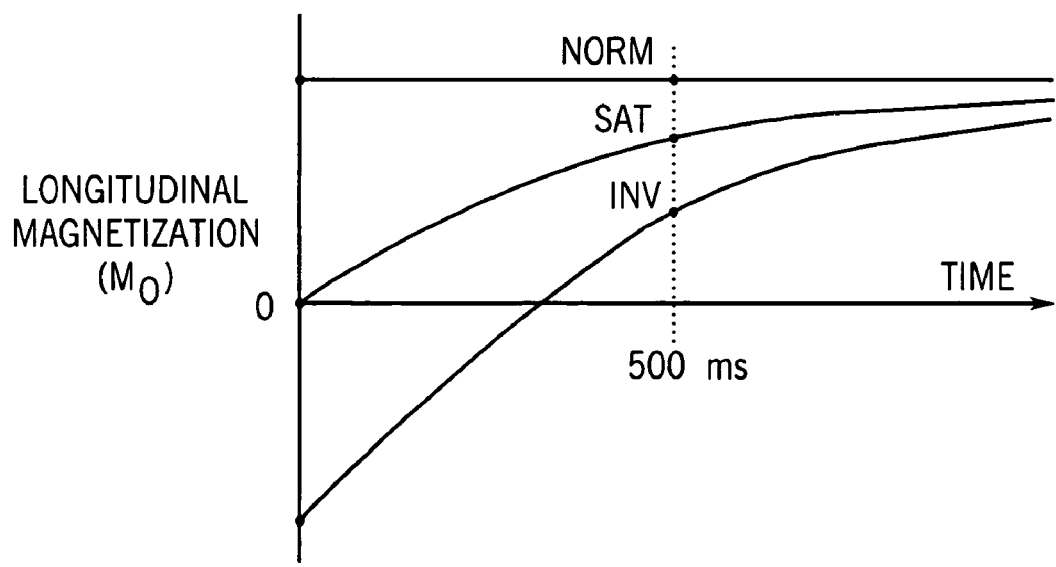
FIG. 4 is a graphic representation of the recovery of longitudinal spin magnetization after the application of a tagging RF pulse.

This same sinusoidal modulation of longitudinal magnetization $M_0$ will be seen a short time later in voxels of the image slice which contain spins that have perfused from the tagging slice. This modulation of the longitudinal magnetization $M_0$ will be reduced in magnitude due to $T_1$ relaxation as illustrated in FIG. 4, but the frequency of the sinusoidal modulation will be the same as that in the, tagging slice. Because the longitudinal magnetization $M_0$ in the image slice is modulated over the time course study, the magnitude of the transverse magnetization produced by an imaging pulse sequence will also be modulated, and the magnitude of the acquired NMR signals from voxels with flowing spins will be modulated at the sinusoidal frequency.

A perfusion image is produced by repeating the tagged pulse sequence over the modulation period and then reconstructing each acquired image in the time course study. For example, if the modulation period spans 16 repetitions as shown in FIG. 8, 512 images might be acquired during the time course study. The magnitude of each corresponding pixel in the 512 images (referred to herein as a voxel vector) is then examined to determine which pixels are modulated in intensity at the sinusoidal frequency. This examination can be done in a number of ways, but a preferred method is to cross correlate the voxel vector with a reference waveform 20 shown in FIG. 8. The reference waveform 20 is a sinusoidal waveform which corresponds to the modulation of the longitudinal magnetization caused by the tagging RF pulses during a modulation period. Those pixels which depict flowing spins that pass through the tagging slice will correlate highly with the reference waveform 20 and their corresponding pixels will be set brighter in the perfusion image. The brightness of the pixels in the perfusion image are thus determined by the pattern of NMR signal magnitude modulation during the time course study rather than a signal magnitude or a difference in signal magnitude.

This new perfusion imaging technique may be performed in either of two basic ways, which I refer to as the "dynamic flow" techniques or "static flow" techniques. The "dynamic flow" techniques employ a short TR which enables many pulse sequences to be played out before the longitudinal magnetization $M_0$ relaxes and the amount of $M_0$ modulation of spins flowing into the imaging slice is lost. This enables spins flowing over a wide range of velocities to be "captured" in any one of the series of short TR image slice acquisitions that are performed following RF tagging.

In the static flow methods of perfusion imaging described below, the pulse sequence repetition rate (TR) is longer (e.g., 2 seconds) and longitudinal magnetization of all tagged spins has relaxed before the next pulse sequence is performed. This means that tagged spins will only be captured in the image slice during the same TR as the RF tagging pulse.

An exemplary fast perfusion imaging technique will now be described in which the pulse sequence TR is short (e.g., 100 msec.) and the tagged spins can be "seen" in the imaging slice over a plurality of pulse sequence TRs. Referring again to FIG. 8, during the first pulse sequence repetition ($TR_1$), spins in the tagging slice are exposed to RF excitation, but spins flowing into the imaging slice have not yet been modulated. During the second pulse sequence ($TR_2$), the tagging slice is again irradiated with an RF tagging pulse, but now faster flowing spins have a chance to reach the image slice from the tagging slice and start affecting the acquired image. As the modulation period progresses, the longitudinal magnetization $M_0$ of these faster moving spins in the image slice will have a modulated magnitude waveform such as that at 22. This waveform 22 is substantially the same as the reference waveform 20 (i.e., high correlation) but it is delayed, or phase shifted by 22.5°. If the distance between the tagging slice and the imaging slice is 10 mm and the TR of the pulse sequence is 100 ms, the velocity of fast flowing spins producing the waveform 22 is 10 cm/sec. Spins that are flowing faster than this velocity will not be detected because they will pass beyond the image slice before the next pulse sequence can be performed.

Slower moving spins can, however, be detected and their velocity indicated. Referring again to FIG. 8, spins flowing at half the speed of the fastest detected spins will reach the imaging slice in two TR periods and begin to modulate the longitudinal magnetization $M_0$ therein. As indicated by waveform 24, as the modulation period is played out, spins flowing at this lower velocity (5 cm/sec. in the above example) modulate the NMR signals in the time course images. The waveform 24 is substantially the same as the reference waveform 20, but it is delayed, or phase shifted by 45°. A similar waveform 26 is produced by very slow moving spins, but it is phase delayed even further. In other words, the phase of the modulated and correlated NMR signals contains spin flow velocity information which can be used to produce an image.

The phase of the modulated and correlated NMR signals for a pixel can be measured by cross correlating it with two reference waveforms. The first waveform 20 is a sinusoidal waveform of one phase which corresponds to the phase of maximum detectable velocity spins, and a second reference waveform 28 is phase shifted 90° therefrom. The NMR signal waveform for each image pixel is cross correlated with the first reference waveform 20 to produce a first correlation value I and it is cross correlated with the second reference waveform 28 to produce a second correlation value Q. The velocity of the flowing spins at each pixel is proportional to arctan (Q/I). In addition, the volume of flow is proportional to:

$$V \propto \sqrt{I^2 + Q^2}.$$

The "static flow" technique of implementing the present invention employs a pulse sequence in which spins are tagged in the tagging slice (FIG. 3) and NMR signals from the same tagged spins are captured during image acquisition in the same TR as they flow through the imaging slice. After image acquisition the longitudinal magnetization is allowed to recover before repeating the pulse sequence. This means that only NMR signals produced by those spins having a specific range of velocities will be "seen" with a modulated amplitude because only spins flowing at a speed which places them in the imaging slice at the moment the imaging pulse sequence is performed will produce modulated transverse magnetization. As with the dynamic flow techniques, a series of tagged pulse sequences are applied where the RF tagging pulse flip angle is modulated over a preselected modulation period. For each voxel the NMR signal magnitudes in the resulting time course images are cross correlated with a reference waveform and the resulting correlation value is used to control the corresponding pixel brightness in a perfusion image.

Figure 9:
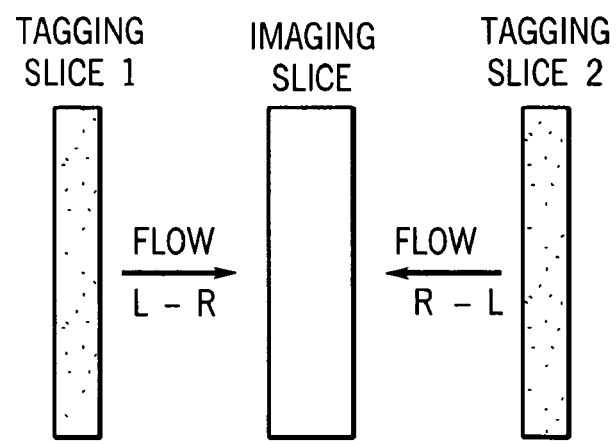
FIG. 9 is a pictorial view showing RF tagging of flowing spins on both sides of an imaging slice for bidirectional flow encoding.
Figure 10:
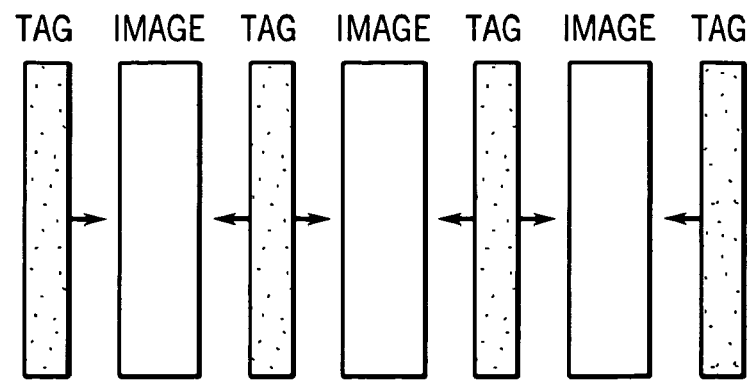
FIG. 10 is a pictorial view showing RF tagging of flowing spins in two directions into a plurality of imaging slices.

These techniques can be easily extended to measure flow from a plurality of tagging slices into a single imaging slice. Such an arrangement is shown in FIG. 9 where flow from left to right is measured into an imaging slice by tagging moving spins in a first tagging slice. Flow from right to left into the imaging slice is also measured at the same time by tagging moving spins in a second tagging slice located on the opposite side of the imaging slice. The trick is to modulate longitudinal magnetization in tagging slice 1 at a different frequency than the modulation in tagging slice 2. For example, the modulation period for tagging slice 1 may be sixteen TR as described above, but the modulation period for tagging slice 2 may be nineteen TR. In this case the NMR signal modulation waveform for each image pixel is cross correlated with reference waveforms at both frequencies to measure perfusion from each of the two tagging slices. This concept can be expanded to include more than one imaging slice and more than two tagging slices as shown in FIG. 10.

DETAILED DESCRIPTION OF THE PREFERRED EMBODIMENT

Figure 1:
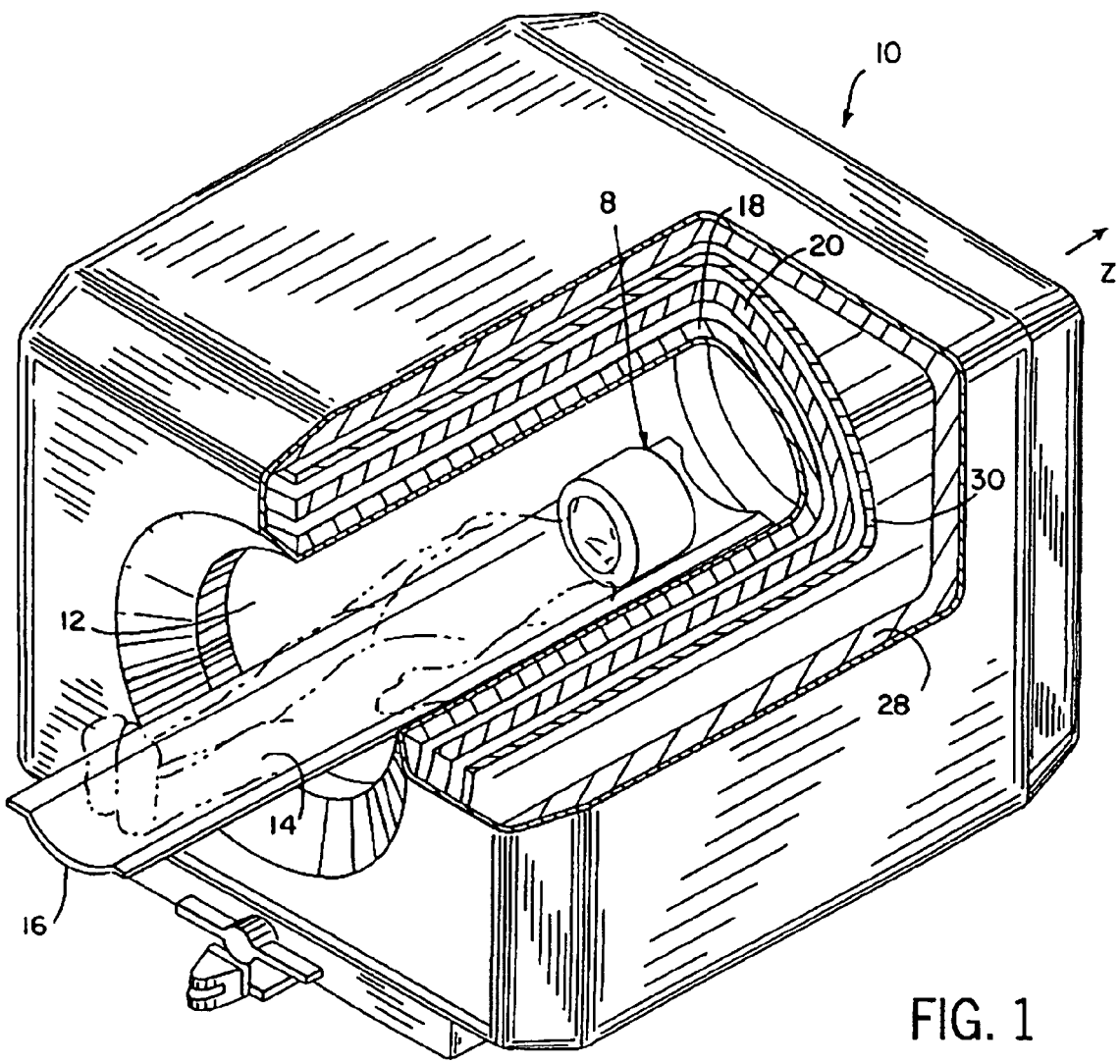
FIG. 1 is a pictorial view with parts cut away of an MRI system which employs the present invention.

Referring to FIG. 1, an MRI magnet assembly 10 has a cylindrical bore tube 12 extending along a z-axis for receiving a supine patient 14 supported on a table 16. The table 16 may move in and out of the bore tube 12 so as to position the patient 14 along the z-axis within the volume of the bore tube 12.

Coaxially surrounding the bore tube 12 is a whole-body RF coil 18 for exciting the spins of the patient 14 into resonance, as has been described. Whole-body gradient coils 20 surround both the bore tube 12 and the RF coil 18 and are also coaxial with the z-axis, to provide x, y and z gradient fields $G_x$, $G_y$, and $G_z$ as required for MRI imaging. The gradient coils 20 are driven by gradient amplifiers (not shown). The polarizing magnetic field $B_0$, aligned with the z-axis is generated by a superconducting magnet coil 28 coaxial with but outside the bore tube 12, the RF coil 18 and the gradient coils 20. The superconducting magnet coil 28 has no external power supply but operates on an initial current which continues unabated in the zero resistivity windings of the superconducting magnet coil 28.

Interposed between the superconducting magnet coil 28 and the gradient coil 20 is a set of shim coils 30 which are used to correct the homogeneity of the polarizing field $B_0$ as is understood in the art. A set of mechanical linkages and insulators (not shown) rigidly connect each of these coils 18, 20, 28 and 30 together to the bore tube 12 so as to resist relative motions generated by the interaction of their various electromagnetic fields.

When a local coil assembly 8 is used in a general purpose system such as that described above, the whole-body gradient coils 20 and whole-body RF coil 18 are disconnected. The local coil assembly 8 is connected to the x, y and z gradient amplifiers (not shown) on the NMR system and it is connected to the system's transceiver through a transmit/receive switch. The preferred embodiment employs a 3 Tesla MRI system manufactured by Bruker Analytische MeBtechnik GmbH and sold under the trademark BIOSPEC 30/60.

Because the gradient fields are switched at a very high speed when an EPI sequence is used to practice the preferred embodiment of the invention, local gradient coils are employed in place of the whole-body gradient coils 20. These local gradient coils are designed for the head and are in close proximity thereto. This enables the inductance of the local gradient coils to be reduced and the gradient switching rates increased as required for the EPI pulse sequence. The local gradient coil assembly 8 also includes a local brain RF coil. In the preferred embodiment, it is a 16 element bandpass endcapped birdcage coil. This brain RF coil is designed to couple very efficiently to the brain of the subject and less efficiently to the lower part of the head. This results in improved brain image quality compared with larger general purpose head coils that couple uniformly to the entire head as well as the neck. An RF shield surrounds the local brain coil and interior to the local gradient coil. This shield isolates RF radiation from the local gradient coil. The shield is designed to avoid perturbation of time varying gradient fields. For a description of these local gradient coils and the RF coil which is incorporated herein by reference, reference is made to U.S. Pat. No. 5,372,137 filed on Jan. 19, 1993 and entitled "NMR Local Coil For Brain Imaging".

To practice the present invention a series of images are acquired from an imaging slice over a period of time. Each image acquisition is preceded by tagging one or more tagging slices with an rf tagging pulse. During this time course image acquisition the rf tagging pulse is modulated in a prescribed manner.

Figure 2:
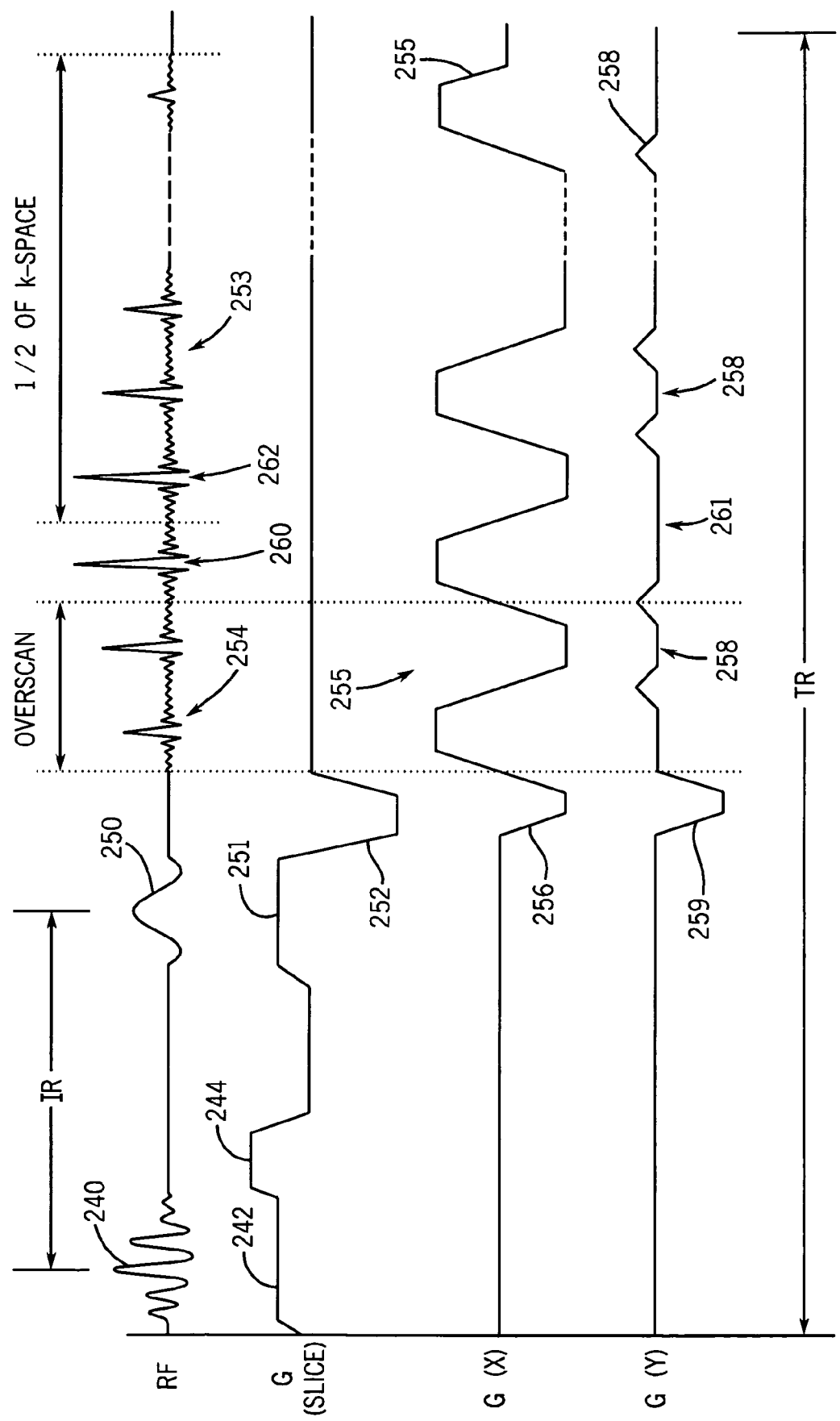
FIG. 2 is a graphic representation of a preferred pulse sequence used to operate the MRI system of FIG. 1.

Referring particularly to FIG. 2, the preferred pulse sequence used to practice the invention is an EPI pulse sequence preceded by a tagging RF pulse 240. The tagging RF pulse 240 is produced in the presence of a slice select gradient pulse 242 to generate transverse magnetization in a tagging slice thus reducing the longitudinal magnetization $M_0$. This is followed by a crusher gradient pulse 244 directed along the slice select axis $G_z$ to dephase the transverse magnetization. At a predetermined interval (IR) thereafter, the EPI pulse sequence is performed to acquire data from the adjacent image slice.

The EPI pulse sequence begins with a 90° RF excitation pulse 250 which is applied in the presence of a $G_z$ slice select gradient pulse 251 to produce transverse magnetization in a slice typically ranging from 1 to 10 mm thick. The excited spins are rephased by a negative lobe 252 on the slice select gradient $G_z$ and then a short time interval elapses before the readout sequence begins. For a 256×256 matrix a total of 128 separate NMR echo signals (or "views"), indicated generally at 253, are acquired during the EPI pulse sequence along with 8 overscan views indicated generally at 254. Each NMR echo signal 253 is a different view which is separately phase encoded to sample a line in k-space.

The NMR echo signals 253 are gradient recalled echo's produced by the application of an oscillating $G_x$ readout gradient field 255. The readout sequence is started with a negative readout gradient lobe 256 and the echo signals 253 are produced as the readout gradient oscillates between positive and negative values. A total of 256 samples are acquired of each NMR echo signal 253 during each readout gradient pulse 255. The successive NMR echo signals 253 are separately phase encoded by a series of $G_y$ phase encoding gradient pulses (or "blips") 258. The first phase encoding gradient pulse is a negative lobe 259 that occurs before the echo signals are acquired to encode the first overscan view at $k_y=-8$. Its area is such that after the overscan views are acquired the center of $k_y$ space is reached and a first central view 260 is acquired. One phase encoding pulse is deleted at 261 such that a second central view 262 is acquired with an opposite polarity readout gradient 255. Subsequent phase encoding pulses 258 occur as the readout gradient pulses 255 switch polarity, and they step the phase encoding monotonically upward through $k_y$ space ($k_y=1-136$). These 128 views that sample one-half of k-space are thus acquired in a centric view order, that is, a view order in which k-space is sampled beginning at the center of k-space and extending toward the periphery of k-space.

The two central views 260 and 262 are used for group delay, phase and frequency-offset correction. One advantage of the preferred pulse sequence is that these two views are acquired at minimal delay after the 90° pulse 250 and exhibit high SNR. As described below, the overscan views 254 are needed to produce the phase map that is necessary to center the central echo on the central pixel, which is required to fill the empty views of k-space ($k_y=-8$ to +8).

This tagged EPI pulse sequence is repeated from 32 to 256 times to acquire a corresponding number of images over a time course of 60 seconds to 4.5 minutes depending on the specific TR prescribed. The tagging RF pulse 240 is modulated during this study by varying its flip angle to velocity encode moving spins. In all the embodiments described below, the pulse sequence TE is set to 15 ms and a 256×256 voxel image is acquired over a 24 cm field of view. The receiver bandwidth is set to 250 kHz and a slice thickness of 1.5 mm is acquired. For the dynamic flow embodiments described below pulse sequence TR is set to 133 ms and a 1.5 mm thick tagging slice is irradiated with a tagging rf pulse 240 applied 50 ms prior to the start of the EPI pulse sequence (IR=50 ms) with resolution less than 128×128. In the dynamic flow methods a total of 450 time course images are acquired in 60 seconds with tagging slices separated from the imaging slice by 5, 10 or 15 mm. In the static flow frequency and phase encoding embodiments described below the pulse sequence TR is set to 2 seconds and the 10 to 70 mm thick tagging slice is separated from 2 to 10 mm from the imaging slice. The RF tagging pulse 240 is applied one second before image acquisition (IR=1 s) and a total of 135 time course images are acquired in 4.5 minutes.

Figure 5:
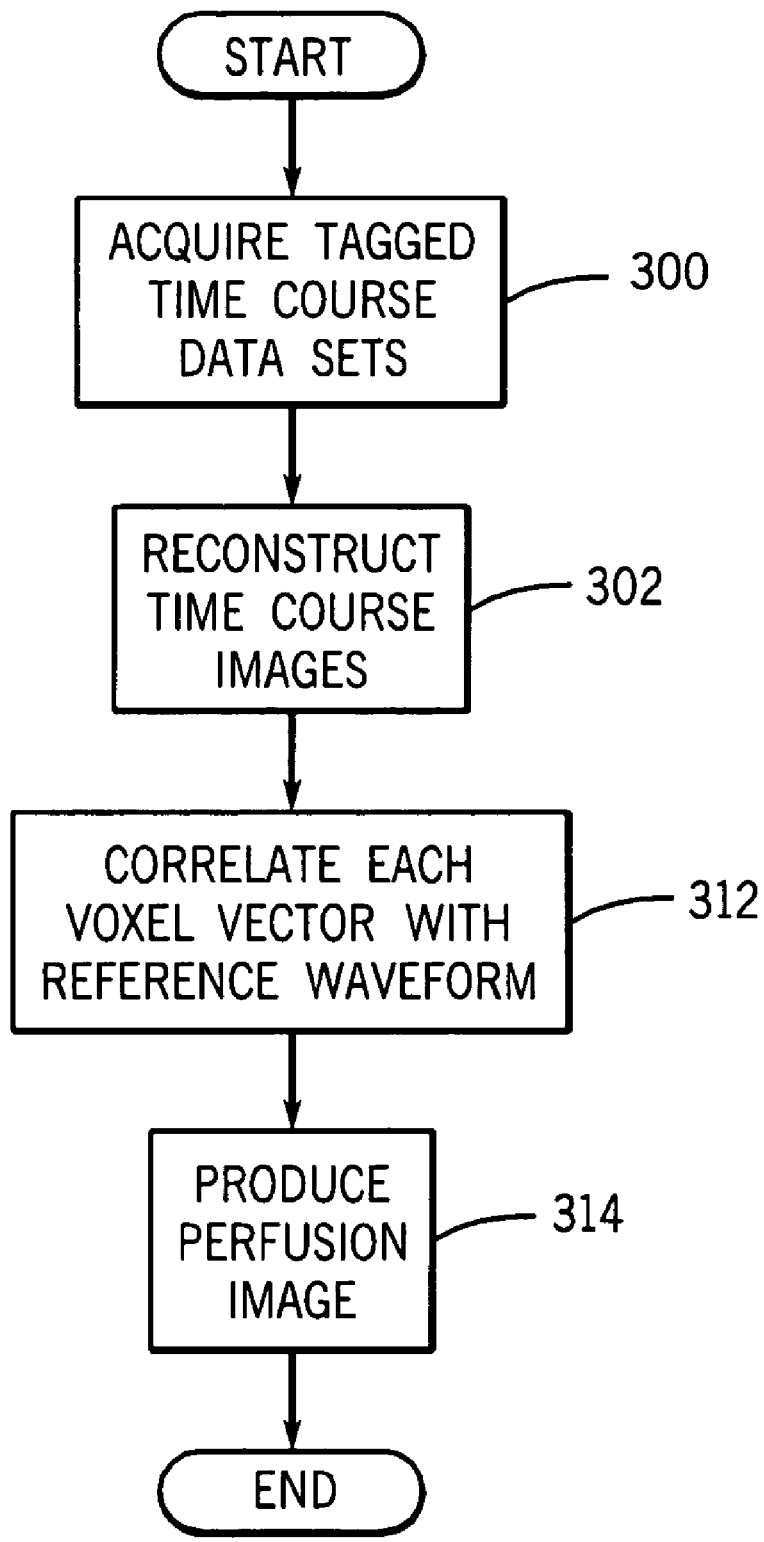
FIG. 5 is a flow chart of a preferred method of practicing the present invention.

Referring particularly to FIG. 5, the time course images are acquired as described above and indicated at process block 300. At the completion of the scan a series of partial k-space data sets are stored and an image is reconstructed from each of these partial k-space data sets as indicated at process block 302. Each partial k-space data set is completed using a method similar to that described by D. E. Purdy, "A Fourier Transform Method Of Obtaining High Resolution Phase Maps For Half-Fourier Imaging," *Proc. SMRM, 7th Annual Meeting, San Francisco* 1998, pg. 968.

Figure 7A:
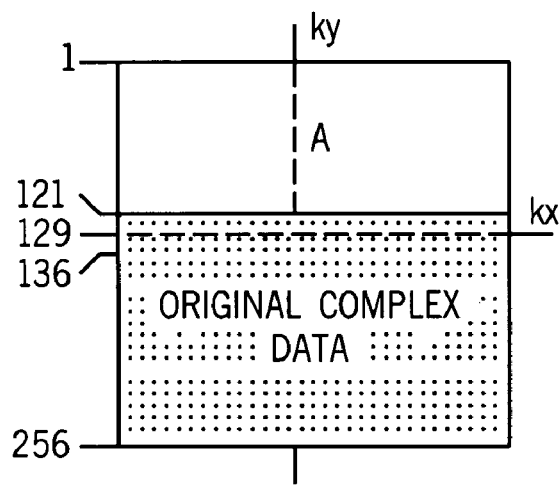
FIGS. 7a-7d are pictorial representations of k-space image reconstruction method used in the preferred embodiment of the invention.

FIG. 7a is a diagram of k-space in which the views actually acquired are indicated by the shaded area. In addition to acquisition of half k-space views 129-256, N overscan lines are acquired adjacent to line 128. In the preferred embodiment N is set to 8, although the software enables other values to be set. Acquisition therefore begins with line 128 and proceeds to line 256.

Figure 7B:
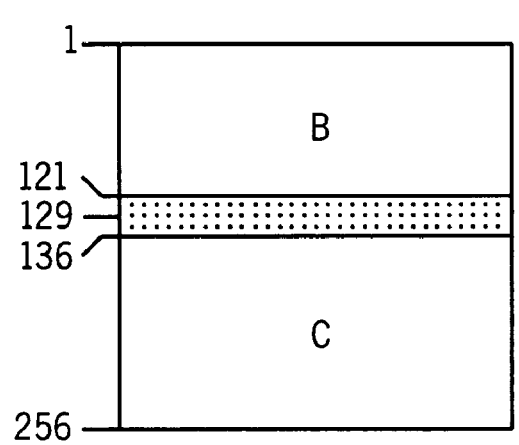

According to the symmetries of the Fourier transform, if the raw k-space data have a symmetrical real part (I) and an asymmetrical imaginary part (Q), then the image is purely real. The first step, therefore, in reconstruction is to center the data on line 129 of k-space such that I and Q have the requisite symmetries. The reduced I and Q matrices are formed from the lines of k-space shown in FIG. 7b, inserting zeroes in spaces B and C. These data are Fourier-transformed to produce 256×256 real and imaginary images. From these images, a pixel-by-pixel phase map (arc tan($Q_M/I_M$)), where $I_M$ and $Q_M$ refer to the image real and imaginary intensities, is constructed and saved. This phase map has dimensions of 256×256, but is smoothed in the y direction as would be expected for 2N resolution.

Figure 7C:
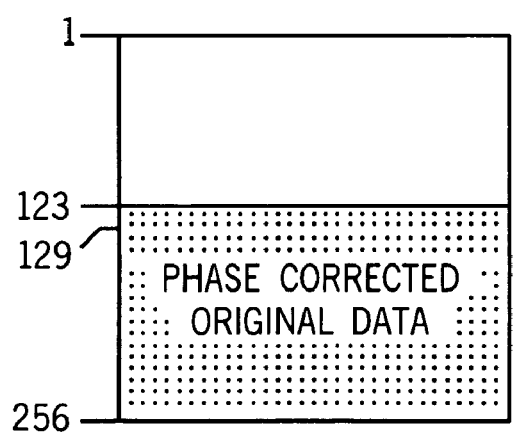

The original data set (FIG. 7a) is transformed to image space by performing a 2-D Fourier transformation and the phase map is used to correct the values such that all information resides in $I_M$ and no intensity is left in $Q_M$ except for small discrepancies between the actual y axis image resolution and the y axis smoothed phase map. The phase-corrected image is then brought back to k-space by inverse FT (FIG. 7c). The data are now centered on line 129. With the data centered and phase corrected, the top part of k-space is filled by the Hermitian conjugate of the lower part as shown in FIG. 7d:

raw(−kx, −ky)=raw*(kx, ky)

Figure 7D:
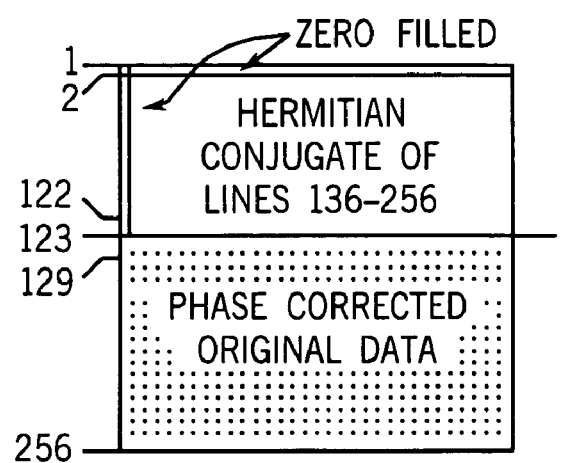

It is also necessary to zero-fill one-half of a vertical column, as indicated in FIG. 7d. Finally, the data of FIG. 7d are transformed to image space by performing a two-dimensional Fourier transformation thereof. The final image is produced by forming a magnitude image $[I_M^2+Q_M^2]^{1/2}$.

Figure 6:
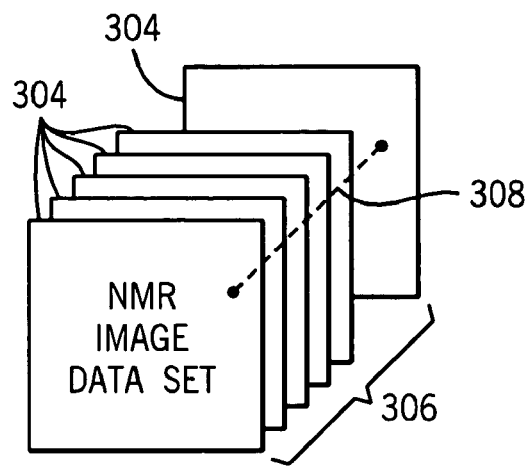
FIG. 6 is a pictorial representation of image data sets acquired over a time course study according to the present invention.

As shown in FIG. 6, these images are organized as set of 256×256 element 2-D arrays 304 in which each element stores the complex value of the NMR signal from one voxel in the scanned slice. Each image array 304 can be used to directly produce an anatomical image of the slice. While each array 304 is a "snap shot" of the slice at a particular time during the time course study, the entire NMR image data set may also be viewed as a single 256×256×n 3-D data array 306 in which the third dimension is time.

he time course NMR image data for one voxel in the array 306 is referred to herein as a time course voxel vector. One such vector is illustrated in FIG. 6 by the dashed line 308. Each time course voxel vector 308 indicates the magnitude of the NMR signal at a voxel in the image slice over the time course study. The resulting time domain voxel vector 308 reveals very clearly any variations in value due to variations in the magnetization of spins flowing into the slice from the tagging slice.

Referring again to FIG. 5, the next step as indicated at process block 312 is to correlate the variations in each voxel vector 308 with a reference vector. The reference vector will be different depending on the particular technique used, but the general concept is to measure the degree of similarity between the variations in voxel vector values and the variations in the rf tagging pulse flip angle over the same time course. The correlation values may then be used to produce an image indicative of perfusion as indicated at process block 314. This correlation operation may be performed by Fourier transform, locking mixer or phase-sensitive detection. The objective is to measure the degree to which each voxel vector resembles, or matches, the pattern of the reference waveform. In the preferred embodiment a cross correlation method such as that described in U.S. Pat. No. 5,603,322 is used in which the dot product of the voxel vector and the reference waveform is calculated.

The first embodiment of a dynamic flow method for perfusion imaging is basically the same as described above, in which two reference waveforms are used to measure the phase of the modulated signal at each voxel. The longitudinal magnetization is not allowed to fully relax before the next tagging pulse is applied by keeping the repetition time (TR) of this sequence below 200 ms. The sequence is operated under the assumption that moving blood will leave a tagging slice before the next tagging pulse is applied. If not, the subsequent tagging pulse with a different flip angle will flip magnetization again, and the final shape of a time-course signal cannot be predicted. A thinner tagging slice is therefore required. The advantage of this technique is that it discriminates between velocities in discreet steps by time of arrival to the readout slice. The fast blood tagged in the first shot will arrive at the readout slice in the second acquisition. Blood moving twice as slow will arrive in the third acquisition, three times slower blood will arrive in the fourth acquisition, and so on. Once equilibrium in tagging and readout is established, the different flow velocities will appear at the same frequency of signal modulation but at a different phase. For every pixel, two data points are created: I, by correlating the voxel vector with a cosine reference waveform, and Q, by correlating with a sine reference waveform. Arctan (Q/I) gives the phase of the NMR signal modulation, which is inversely proportional to the flow velocity.

An apparent drawback of this method is that a set of discrete velocities is measured. Lower velocities are sampled more densely than higher velocities. The other drawback lies in decay of tagging magnetization due to the relaxation time $T_1$. The slower blood arrives later to the imaging slice, and the amplitude of longitudinal magnetization oscillations is reduced due to $T_1$ relaxation. This is not the case for the slow methods described below in which detected flowing spins always arrive in the imaging slice during the same TR. The advantage of this fast imaging technique lies in its speed: the S/N ratio increases proportionally to the ratio of the total image acquisition time to the total experiment time. The dynamic flow techniques are in general superior, although the idle time in slower imaging techniques discussed below can be used to acquire more slices.

Figure 11:
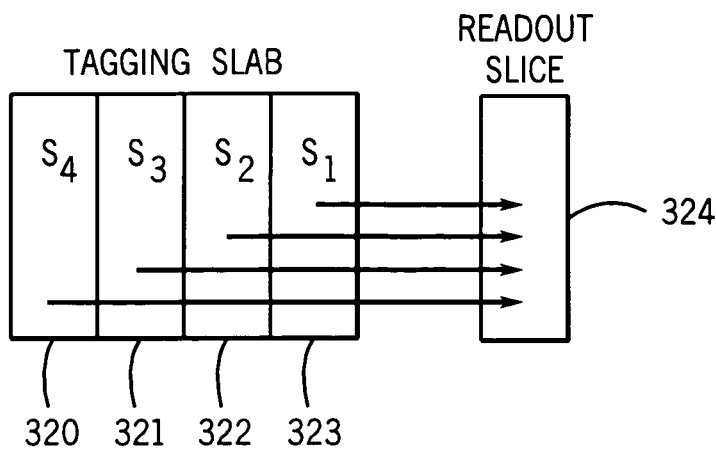
FIG. 11 is a pictorial representation of a tagging slab having a plurality of separate tagging slices.

Another embodiment of the invention employs the static flow technique, and it overcomes the spin velocity limitation of this technique discussed above by using a more complex tagging method. Referring particularly to FIG. 11, with this embodiment a thick slab is employed for tagging and this thick slab is divided into a plurality of separate slices 320-323 which are located at different distances from the imaging slice 324. The time between tagging the whole slab and the acquisition of the image is 0.5 seconds, and thus the tagged spins reaching the image slice from the furthest tagging slice must travel further during this time interval and will have a higher velocity than tagged spins from the closest tagging slice. Thus, modulated NMR signals produced by spins flowing into the imaging slice over a range of different velocities can be "seen" by the imaging pulse sequence and used to produce the perfusion image.

Figure 12:
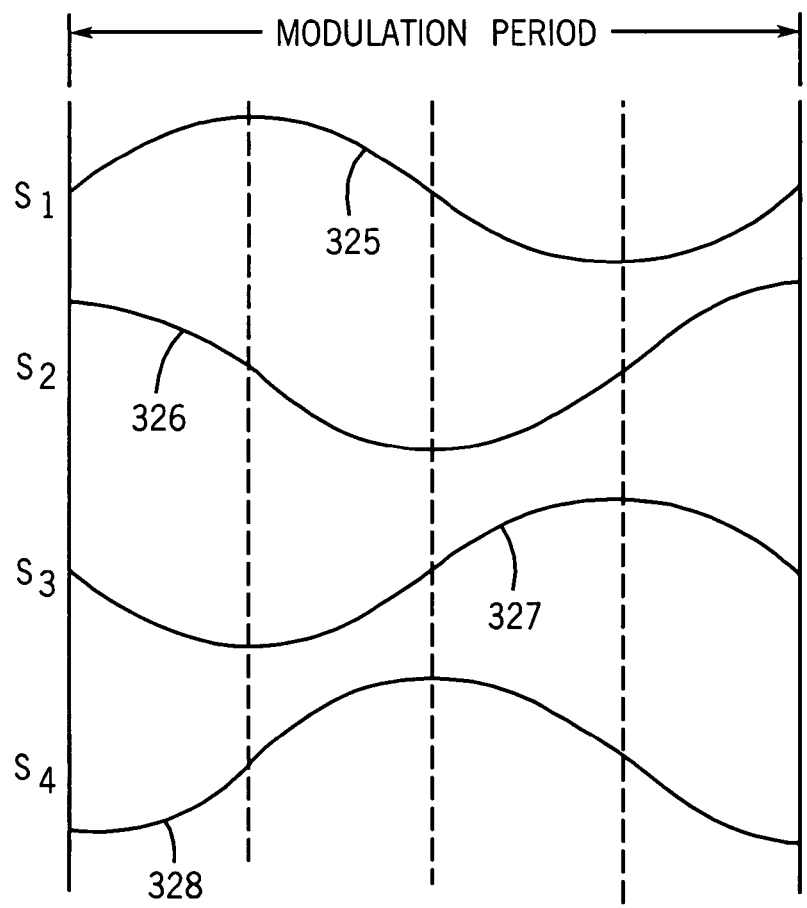
FIG. 12 is a graphic illustration of a phase encoding method of differentiating spins from the tagging slices of FIG. 11.

To distinguish the different velocities of these spins, the flip angle modulation waveforms are different for each tagging slice. In this embodiment all the modulation waveforms are sinusoidal and have the same frequency and period. As shown in FIG. 12, however, the phase of each modulation waveform is different. With four tagging slices 320-323, four separate spin flow velocities are encoded by using four sinusoidal modulation waveforms 325-328 that are shifted in phase 90° from each other. The acquired time course images may be processed as described above for the fast technique method and two orthogonal sinusoidal reference waveforms of the same frequency may be correlated with the resulting voxel vectors to produce I and Q values from which the phase can be detected. A perfusion image can then be produced in which pixels are color coded with the detected phase/spin velocity.

Only four spin flow velocities are detected using this four-slice tagging slab of FIGS. 11 and 12, corresponding to four phase-shifted modulation waveforms. Additional slices can be added to improve velocity resolution, but the generation of the resulting RF tagging pulses can become difficult. The RF tagging pulses for each tagging slice 320-323 are separately generated and commercially available MRI systems have a limit on the number of RF pulses that can be prescribed in a pulse sequence. It is contemplated, however, that tailored RF tagging pulses can be created in which the frequency spectrum of the pulse is modulated to produce many phase-shifted tagging slices with uniformly changing profiles. The pulse shape is derived as an inverse Fourier transform of the desired spectrum and is multiplied by a Hamming window to reduce truncation artifacts. Such tagging will produce a uniform distribution of the initial phase across a slab, allowing for uniform velocity detection.

This method can be used also for bi-directional multi-slice flow detection by exciting different slabs with different frequencies as shown in FIG. 9. In this embodiment tagging slab 1 is divided into four tagging slices which employ four phase-displaced tagging modulation sinusoidal waveforms at frequency $f_1$ and slab 2 is divided into four tagging slices which employ four phase-displaced tagging modulation waveforms at a second frequency $f_2$. In this case each voxel vector is correlated with four reference waveforms: two at frequency $f_1$, and two at frequency $f_2$.

Figure 13:
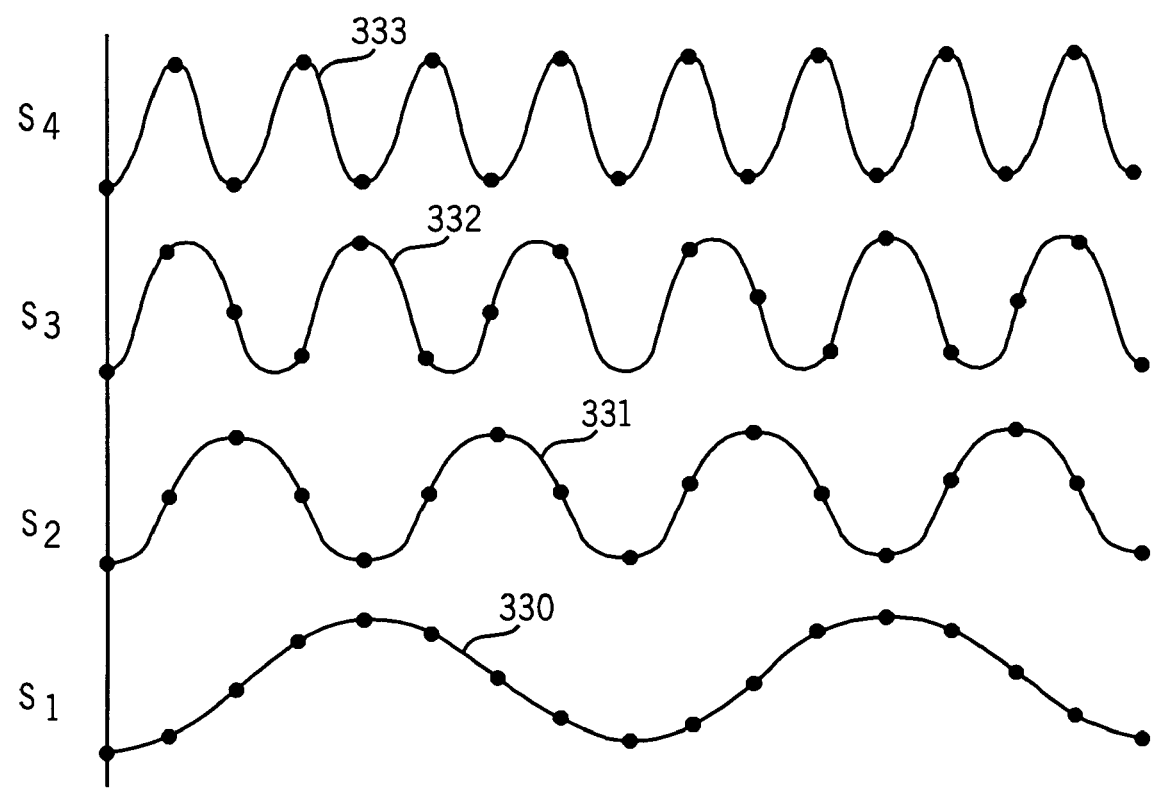
FIG. 13 is a graphic illustration of a frequency encoding method of differentiating spins from the tagging slices of FIG. 11.

Another slow technique which is very similar to that just described uses tagging pattern frequency rather than tagging pattern phase to differentiate between spin flow velocities. Referring particularly to FIG. 11, the four tagging slices 320-323 in this embodiment modulate their tagging flip angle during a time course study at a different frequency. This is illustrated by the four flip angle modulation waveforms 330-333 in FIG. 13. In this case the modulation period of each waveform 330-333 is different and it is necessary to obtain time course images over a time period at least as long as the longest modulation period.

This frequency encoding technique will produce oscillations in the acquired NMR signal over the time course study at four corresponding frequencies. Faster flow will show itself at a higher frequency in a time-course. In this particular embodiment, the tagging frequency is distributed linearly across the slab and will not result in the acquired linear encoding of flow. To achieve linear encoding, one has to code a frequency inversely proportional to the spacing between the imaging slice 324 and the center of the tagging slice 320-323. This can be achieved by modifying slab profiles accordingly, and creating tailored tagging pulses as described above. Then a simple Fourier transform of a time-course voxel vector will produce a frequency spectrum indicative of the frequency components therein. Flowing spins are revealed by a peak in this spectrum at a tagging modulation frequency. The position of the highest peak in the resulting spectrum indicates spin velocity. An advantage of this frequency encoding method is the possibility of distinguishing several velocities within a voxel by detecting a set of peaks in the spectrum. Linearity of flow versus frequency, while possible, is not a most desired feature. It is possible to shape tagging profiles differently to achieve a logarithmic scale of flow. This will give uniform relative steps in the velocity encoding direction.

The preferred embodiments described above all employ a sinusoidal tagging modulation waveform. It is also possible to use other, non-sinusoidal waveforms. Sinusoidal tagging uses a limited amount of the available spectrum, defined as one-half of the number of tags per cycle. Even multi-slice tagging with bi-directional flow detection will not span the available spectrum. When the spectral tagging width is increased, care has to be taken to avoid overlap with the spectrum of a subsequent tagging slab. Both spectra can be interleaved, but should not share a common harmonic to avoid cross-talk inflow detection by the correlation method. The information in the broadened spectrum is coherent, and adds, but noise is not coherent and will average. This will lead to an improved S/N ratio of detection. Special care has to be taken in development of a tagging modulation waveform shape because simple broadening of a spectrum with flat amplitude will increase the peak amplitude somewhere in the time course. The tagging amplitude cannot exceed the range of plus or minus the maximum longitudinal magnetization—the equivalent of 0° to 180° of flip angle. The velocity of flow will be detected in two steps. In the first step, a set of known shape functions with different time shifts will be used to derive a set of correlation coefficients for each imaging pixel. If the highest correlation coefficient in this set passes a threshold value (usually 0.5, but it depends on noise), it will indicate the velocity of flow. In the second step, the correlation value will be computed for this delay to derive an amplitude of oscillations that can be used to derive a volume of flow.

The invention claimed is:

1. A method for producing a perfusion image with an MRI system, the steps comprising:
    a) repeatedly applying an RF tagging pulse with the MRI system to spins flowing into an image slice and modulating the flip angle of the RF tagging pulse in accordance with a tagging pattern over a modulation time period;
    b) acquiring a series of time course MR image data sets by performing imaging pulse sequences with the MRI system over a time period that includes the modulation time period;
    c) reconstructing from the image data sets a corresponding set of time course images having voxel vectors which indicate the variations in NMR signal at corresponding image slice voxels over the acquisition time period;
    d) detecting perfusion by identifying voxel vectors having variations in NMR signal which correspond to the tagging pattern; and
    e) producing a perfusion image in which perfusion is indicated at the identified voxels.

2. The method as recited in claim 1 which the tagging pattern is sinusoidal.

3. The method as recited in claim 1 which step d) is performed by cross correlating voxel vectors with a reference waveform that corresponds to the tagging pattern.

4. The method as recited in claim 1 which steps a) and b) are performed by repeatedly performing a pulse sequence with the MRI system that includes:
    i) producing an RF tagging pulse;
    ii) waiting for a selected time interval (IR); and
    iii) producing an RF excitation pulse and acquiring an NMR signal in the presence of an imaging magnetic field gradient.

5. The method as recited in claim 4 in which the pulse sequence includes producing a magnetic field gradient pulse at the same time as the RF tagging pulse to selectively excite spins in a region adjacent the image slice.

6. The method as recited in claim 5 in which step iii) is performed using an echo planar imaging (EPI) pulse sequence which acquires a plurality of NMR signals.

7. The method as recited in claim 6 in which a sufficient number of NMR signals are acquired by the EPI pulse sequence to produce an MR image data set from which a time course image can be reconstructed.

8. The method as recited in claim 1 which includes producing a magnetic field gradient pulse at the same time as the RF tagging pulse to selectively excite spins in a tagging slab located adjacent the image slice.

9. The method as recited in claim 8 in which the RF tagging pulse is shaped to modulate the flip angle produced in each of a plurality of tagging slices in the tagging slab in accordance with a different tagging pattern; and step d) is performed to identify voxel vectors having variations in NMR signal which correspond to each of the different tagging patterns.

10. The method as recited in claim 9 in which the tagging patterns are sinusoidal and each has a different frequency.

11. The method as recited in claim 9 in which the tagging patterns are sinusoidal and each has a different phase.

12. The method as recited in claim 11 in which step d) includes:

i) measuring the correlation of each voxel vector with a first sinusoidal reference waveform having a first phase;

ii) measuring the correlation of each voxel vector with a second sinusoidal reference waveform having a phase which is 90° shifted from said first phase; and iii) determining in which tagging slice flowing spins were tagged using the correlation measurements from steps i) and ii).

* * * * *